United States Patent [19]

Martin, III

[11] 4,132,953
[45] Jan. 2, 1979

[54] SQUELCH CIRCUIT FOR A RADIO RECEIVER

[75] Inventor: Robert J. Martin, III, Lynchburg, Va.

[73] Assignee: General Electric Company, Lynchburg, Va.

[21] Appl. No.: 838,007

[22] Filed: Sep. 29, 1977

[51] Int. Cl.² .............................................. H04B 1/10
[52] U.S. Cl. .................................. 325/478; 325/456; 330/141; 307/350
[58] Field of Search ............... 325/478, 472, 473, 474, 325/479, 476, 480, 456, 436; 179/1 VL, 1 P, 1 SW; 330/141; 328/58; 307/235 R, 235 H, 235 N

[56] References Cited

U.S. PATENT DOCUMENTS

| | | | |
|---|---|---|---|
| 3,596,184 | 7/1971 | Hanus et al. | 325/478 |
| 3,628,058 | 12/1971 | Espe | 307/235 R |
| 3,660,765 | 5/1972 | Glasser et al. | 325/478 |
| 3,939,431 | 2/1976 | Cohlman | 325/478 |

Primary Examiner—Robert L. Griffin
Assistant Examiner—Tommy P. Chin
Attorney, Agent, or Firm—Williams, James J.

[57] ABSTRACT

A squelch circuit is provided with fast-acting means for unsequelching a receiver when a strong FM signal is received and for squelching a receiver when a strong FM signal is terminated. The squelch circuit is also provided with slow-acting means for unsquelching a receiver when a weak or slowly increasing FM signal is received and for squelching a receiver when a weak FM signal is terminated or when a strong or weak FM signal fades slowly.

9 Claims, 5 Drawing Figures

SQUELCH CIRCUIT FOR A RADIO RECEIVER

BACKGROUND OF THE INVENTION

My invention relates to a squelch circuit for a radio receiver, and particularly to such a squelch circuit that provides fast or slow operation, depending upon the characteristics of the received frequency modulated signal.

Squelch circuits are used with frequency modulation (FM) radio receivers to eliminate noise that would be heard in the absence of a received FM signal. To eliminate as much noise as possible after an FM signal has terminated, a fast-acting squelch circuit is desirable. However, where a weak FM signal has terminated, or where an FM signal is subject to fading (particularly when received by or from a moving vehicle), noise is frequently already present so that a slow-acting squelch circuit is desirable.

Accordingly, a primary object of my invention is to provide a new and improved squelch circuit for a frequency modulation radio receiver.

Another object of my invention is to provide a new and improved squelch circuit that does not unsquelch a radio receiver for frequency modulated signals whose strength is below a predetermined level or magnitude.

Another object of my invention is to provide a new and improved squelch circuit that rapidly unsquelches a radio receiver upon receipt of a strong frequency modulated signal, and that rapidly squelches the receiver upon termination of a strong frequency modulated signal.

Another object of my invention is to provide a new and improved squelch circuit which operates relatively slowly when a relatively weak frequency modulated signal is terminated, thus improving the operation of the receiver.

Another object of my invention is to provide a new and improved squelch circuit which operates slowly when a frequency modulated signal begins to fade, thus maintaining operation of the receiver during relatively normal conditions of fade, such as caused by operation of a moving vehicle or multiple propagation paths, such as caused by reflections.

Another and fairly specific object of my invention is to provide a new and improved squelch circuit for use with a frequency modulation radio receiver that operates with priority search lock monitor arrangements.

SUMMARY OF THE INVENTION

Briefly, these and other objects are achieved in accordance with my invention by a squelch circuit having first means for producing a first signal whose magnitude is related to the magnitude of a received frequency modulation radio signal. A first timing circuit is connected to the first means. The first timing circuit has an output for producing a first timing signal whose magnitude increases at a first rate in response to the magnitude increase of the first signal, and whose magnitude decreases at a second rate in response to the magnitude decrease of the first signal. A second timing circuit is also connected to the first means. The second timing circuit has an output for producing a second timing signal whose magnitude increases at a third rate in response to the magnitude increase of the first signal, and whose magnitude decreases at a fourth rate in response to the magnitude decrease of the first signal.

A first control circuit is provided, and includes a timing signal input connected to the first timing circuit output. A first threshold circuit produces a first threshold signal having controllable upper and lower levels. Means are provided for causing the first threshold signal to have the lower level in response to the first timing signal magnitude exceeding the level of the first threshold signal. A squelch output is provided for producing an unsquelch signal in response to the first timing signal magnitude exceeding the level of the first threshold signal, and for producing a squelch signal in response to the first timing signal magnitude being less than the level of the first threshold signal.

A second control circuit is provided, and has a timing signal input connected to the second timing circuit. A second threshold circuit is included for producing a second threshold signal. A control output is connected to the first threshold circuit of the first control circuit to cause the first threshold signal to have the lower level in response to the second timing signal magnitude decreasing below the second threshold signal before the first timing signal magnitude decreases below the upper level of the first threshold signal.

This circuit squelches and unsquelches rapidly for strong frequency modulation signals, but squelches and unsquelches slowly for weaker frequency modulation signals or for frequency modulation signals which fade.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

DESCRIPTION OF THE PREFERRED EMBODIMENT CIRCUIT DESCRIPTION

Figure 1A:
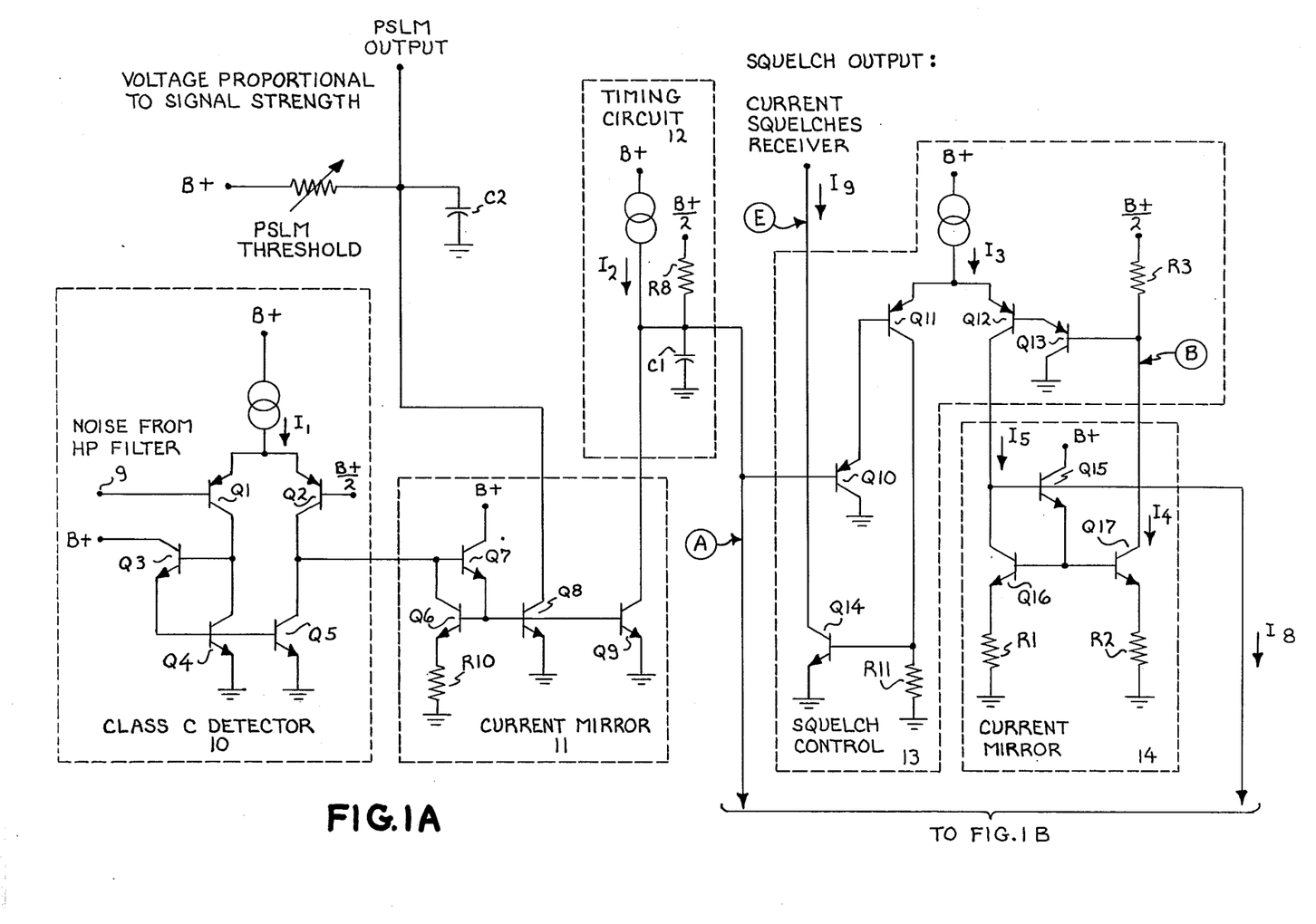
FIGS. 1A and 1B show a circuit diagram of the preferred embodiment of my invention.
Figure 1B:
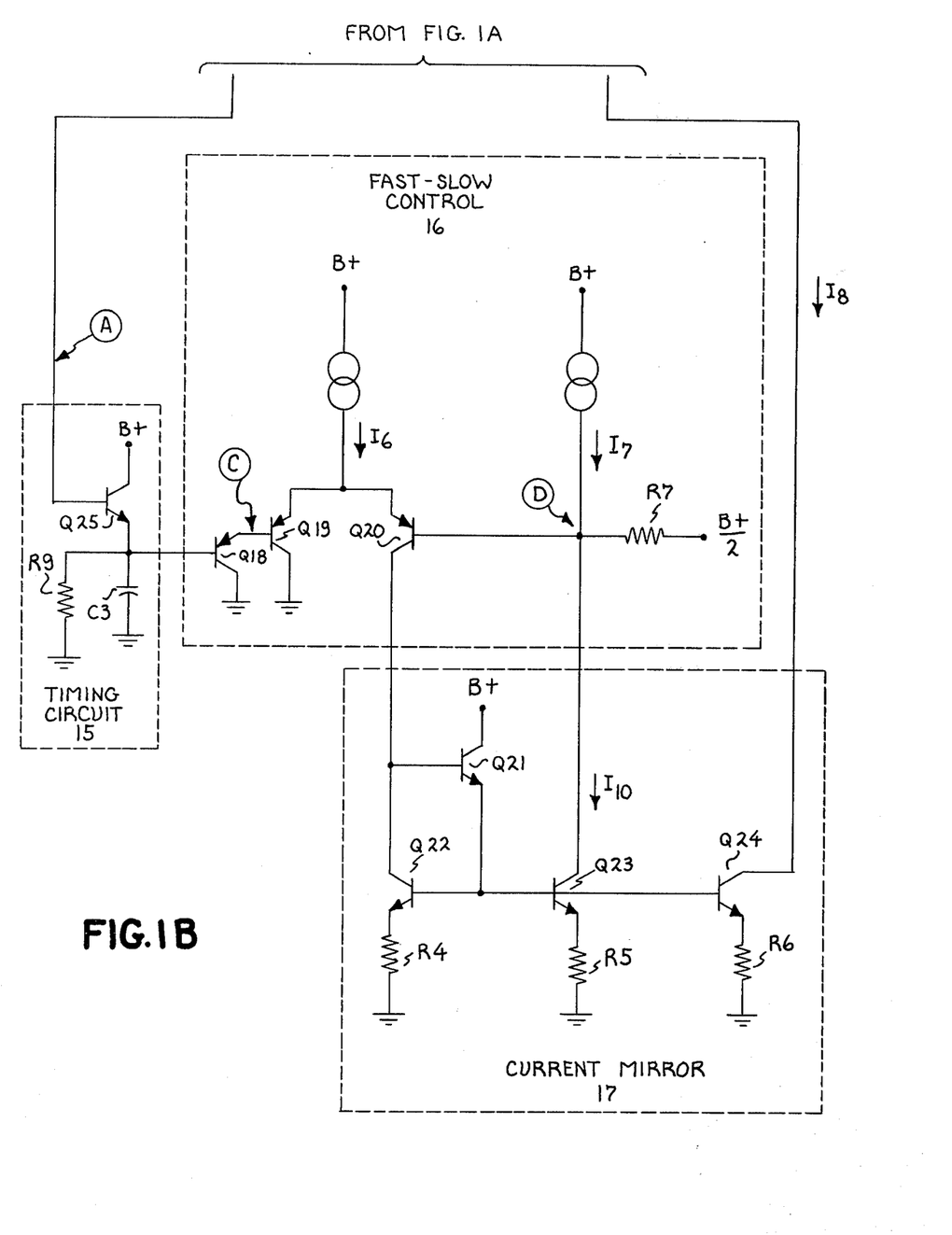

A circuit diagram of my squelch circuit is shown in FIGS. 1A and 1B which are connected together as indicated. My squelch circuit is intended to operate with a typical frequency modulation (FM) receiver in which the demodulated or detected signals are applied to an audio circuit under the control of a squelch circuit output. These demodulated or detected signals are also applied to a high pass filter which eliminates most of the voice frequencies, and passes only audio noise frequencies of relatively high frequency, typically above 6 kilohertz. The noise frequency voltage is applied to an input terminal 9 of my squelch circuit. For convenience of description, I have divided my squelch circuit into a number of subcircuits, each of which is shown enclosed in dashed line rectangles. My squelch circuit is provided with a suitable source of direct current potential B+ which is positive with respect to ground or a reference potential. My squelch circuit also utilizes a source of direct current potential which is half the potential B+, and is indicated as B+/2. My squelch circuit also utilizes a number of current sources which I have indicated as two circles partially overlapping each other. Such current sources are intended to indicate a fixed source of direct current for utilization in a particular circuit.

The input terminal 9 is connected to the base of a transistor Q1 in a class C dtector 10. The input voltage at the terminal 9 is compared against the voltage source $B+/2$ applied to the base of a transistor Q2. A source current I1 flow through one of the transistors Q1, Q2 as a function of their relative base voltages, and also flows through one of the respective transistors Q4, Q5 to ground. An output current is derived from the detector 10 at the collector of the transistor Q5, and applied to a current mirror 11. This output current from the detector 10 increases with an increasing noise voltage at the terminal 9, and decreases with a decreasing noise voltage at the terminal 9. Expressed in terms of the received signal strength, the output current from the detector 10 decreases with an increased signal voltage, and increases with a decreased signal votage.

The current mirror 11 is provided in order to supply an output for a priority search lock feature of a receiver is such an output is needed, as well as an output for my squelch circuit. Current from the detector 10 is applied to the current mirror 11 at the base of a transistor Q7 and the collector of a transistor Q6. The transistors Q7, Q6 cause each of the transistors Q8, Q9 to conduct equal collector currents controlled by the transistors Q6. The collector current of the transistor Q8 is supplied as the priority search lock monitor output. A greater signal strength decreases this current and raises the search lock monitor voltage. A lesser signal strength increases this current and lowers the search lock monitor voltage. The collector current of the transistor Q9 is supplied to a first timing circuit 12. The current flow in the transistor Q9 controls the flow path of source current I2 in the timing circuit 12. A timing capacitor C1 is charged by the source current I2 and the current from a resistor R8 connected to the voltage source $B+/2$ through the resistor R8 so that the current I2 cannot charge the capacitor C1 beyond some limit which is less than the voltage source $B+$. As a result, the capacitor C1 is always charged to some voltage which is a non-linear inverse function of the noise voltage or a non-linear direct function of the signal voltage. If the signal voltage increases, the transistor Q9 conducts less so that the output voltage A across the capacitor C1 increases. If the signal voltage decreases, the transistor Q9 conducts more, so that the output voltage A across the capacitor C1 decreases. In the timing circuit 12, it will be noted that the capacitor C1 may be discharged by the transistor Q9 through a low impedance path.

The output voltage A is applied to one input of a squelch control circuit 13 comprised of the transistors Q10, Q11, Q12, Q13, Q14. This voltage A is compared with a threshold voltage B provided by a source voltage $B+/2$ and a resistor R3. This threshold voltage B may have an upper level when the current I4 is at a low value, and a lower level when the current I4 is at a high value. The control circuit 13 includes a source of current I3 which flows primarily through either of the transistors Q11, Q12. If the voltage A exceeds the voltage B, most of this current I3 flows through the transistor Q12. This turns off the transistor Q14 so that its current I9 is zero or very low, and the receiver is unsquelched. But if the voltage B exceeds the voltage A, then most of this current I3 flows through the transistor Q11. This turns on the transistor Q14 so that its current I9 is high, and the receiver is squelched.

The collector of the transistor Q12 is connected to a current mirror circuit 14 which is arranged so that the collector current I4 in the transistor Q17 is equal to the collector current I5 in the transistor Q16. If the voltage A exceeds the voltage B, then most of the source current I3 flows through the transistor Q12. The current I4 increases to cause the voltage B to fall from the voltage source $B+/2$ by an amount equal to the voltage drop of the current I4 through the resistor R3. However, if the voltage A is less than the voltage B, then most of the current I3 flows through the transistor Q11. The current I4 falls substantially to zero so that the voltage B is equal to the voltage source $B+/2$. The voltage B can also be varied between upper and lower levels by a current I8 which controls the amount of the current I5 that can be supplied to the base of the transistor Q15. This current I8 is under the control of a fast-slow control circuit 16 as will be explained. If the current I8 is increased, the base current of the transistor Q15 is decreased, the current I4 is decreased, and the voltage B is increased. If the current I8 decreases, the current I4 is increased to lower the voltage B.

The voltage A representative of the signal strength is also applied to a second timing circuit 15 comprised of a transistor Q25 which charges a capacitor C3 from the voltage source $B+$. The capacitor C3 may be discharged through a resistor R9 which presents a much higher impedance than the transistor Q9 does for discharging the capacitor C1.

The voltage on the capacitor C3 is applied to the fast-slow control circuit 16 which comprises a current source I6 provided by a voltage source $B+$. The voltage on the capacitor C3 is applied to a first transistor Q18 whose emitter voltage C is applied to a second transistor Q19 and compared with a threshold voltage D at a transistor Q20. If the voltage C exceeds the voltage D, then most of the current I6 flows through the transistor Q20. If the voltage D exceeds the voltage C, then most of the current I6 flows through the transistor Q19. The voltage D is determined by the path that the current source I7 takes after flowing toward the junction of a resistor R7 and the base of transistor Q20. If the current I10 flowing from this junction is zero, then all the current I7 flows though the resistor R7 so that the voltage D is equal to the voltage $B+/2 + (I7 \times R7)$. If the current I10 has some magnitude, then the voltage D is equal to the voltage $B+/2 + (I7 - I10) \times R7$.

A current mirror circuit 17 is provided to set the currents I8, I10 as a function of the collector current of the transistor Q20 and the emitter resistors R4, R5, R6. The resistors R4, R5, R6 are chosen so that the current I10 is one-third the collector current of the transistor Q20, and the current I8 is twice the collector current of the transistor Q20. The currents I10, I8 depend upon the relative magnitudes of the voltages C and D. If the voltage C exceeds the voltage D, collector current of the transistor Q20 increases so that the currents I10, I8 increase. The increased current I10 causes the voltage D to decrease. Conversely, if the voltage C is less than the voltage D, then the currents I10, I8 decrease to substantially zero. The decreased current I10 causes the voltage D to increase.

The current I8 determines how much of the current I5 is available for base current in the transistor Q15. This, in turn, determines the current I4 and the voltage B. If the current I8 increases, less base current flows in the transistor Q15 and less collector current I4 flows through the transistor Q17. Hence the voltage B increases. Conversely, if the current I8 decreases, more base current flows in the transistor Q15 and more collector current I4 flows through the transistor Q17. This causes the voltage B to fall unless the voltage B has already fallen because it is exceeded by the voltage A.

Summarizing my circuit as thus far explained, if a received signal decreases very rapidly, as it would when a carrier is turned off, the voltage A drops much more rapidly than the voltage C because the voltage across the capacitor C1 is discharged through the transistor Q9, whereas the voltage across the capacitor C3 must be discharged through the resistor R9. However, if the strength of a received signal decreases slowly, as it might under conditions of fading, then the voltage C decreases at almost the same rate as the voltage A. This decrease in the voltage C diverts most of the current I6 through the transistor Q19 so that the currents I10, I8 decrease. This decrease in the current I8 causes the voltage B to also decrease. Thus, the threshold level B in the control circuit 13 is decreased, so that weaker signals still do not divert the current I3 through the transistor Q11 to squelch the receiver. The current I3 continues to flow through the transistor Q12 so that the receiver remains unsquelched. However, if the received signal voltage A does fall below the lower threshold voltage B, then the receiver will become squelched.

Circuit Operation

My circuit of FIG. 1 was constructed and operated with components having the following values or characteristics:

| Voltage Source B+ | 5.2 Volts |
|---|---|
| Transistors Q1 through Q25 | Integrated circuit type |
| Capacitor C1 | 0.68 microfarad |
| Capacitor C2 | 0.1 microfarad |
| Capacitor C3 | 1.0 microfarad |
| Resistor R1 | 2000 ohms |
| Resistor R2 | 2000 ohms |
| Resistor R3 | 50000 ohms |
| Resistor R4 | 2000 ohms |
| Resistor R5 | 6000 ohms |
| Resistor R6 | 1000 ohms |
| Resistor R7 | 20000 ohms |
| Resistor R8 | 25000 ohms |
| Resistor R9 | 260000 ohms |
| Resistor R10 | 1400 ohms |
| Resistor R11 | 47000 ohms |

The operation of this circuit will be described with reference to FIGS. 2, 3, and 4. In each figure, all of the waveforms are plotted along a respective common time axis. In each figure, the upper waveform shows the signal applied to the radio receiver in terms of decibels of noise quieting. In each figure, the waveform designated E shows when the receiver is squelched and unsquelched. In each figure, the waveforms A, B, C, and D are plotted against a common voltage axis. Each of the waveforms A, B, C, and D represent the voltages at the points indicated with similar designations A, B, C, and D in FIG. 1.

Figure 2:
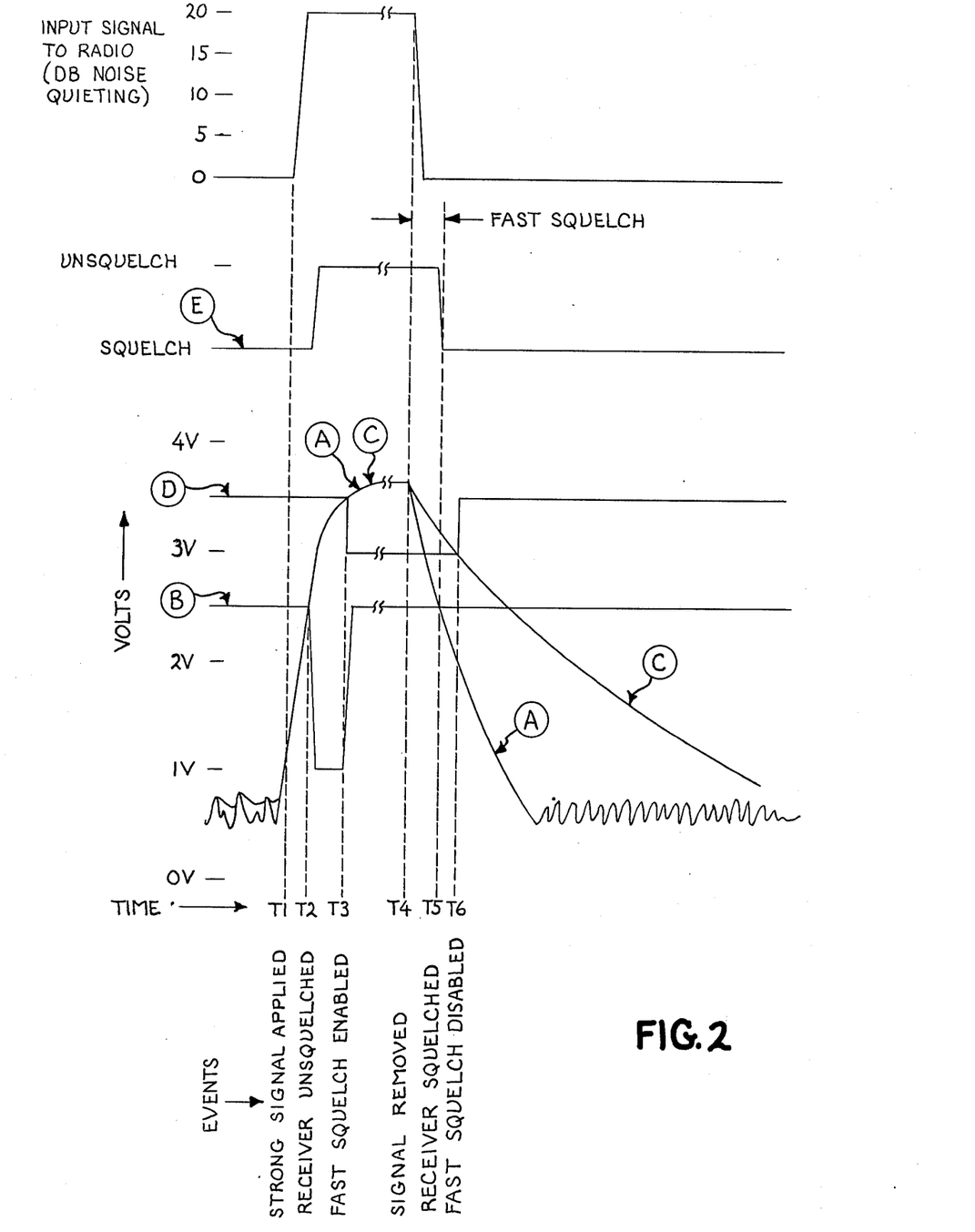
FIGS. 2, 3, and 4 show waveforms for illustrating the operation of my circuit of FIGS. 1A and 1B.

FIG. 2 shows the operation of my circuit for a relatively strong received signal. Prior to the time T1, the first threshold voltage B is at its relatively high level of B+/2 (2.6 volts), and the second threshold voltage D is at its relatively high level of approximately 3.5 volts. The strong signal is applied at the time T1 and rises rapidly to 20 decibels of quieting. As this signal rises, the voltage A from the timing circuit 12 rises rapidly, and the voltage C rises at substantially the same rate. At the time T2, the voltage A exceeds the voltage B which causes the control circuit 13 to switch conduction from the transistors Q10, Q11 to the transistors Q12, Q13. This causes the current I5 to increase, so that the transistor Q17 is turned on. This rapidly lowers the voltage B to its lower level of approximately 1 volt. When the voltage B falls, this provides snap or rapid turnoff of the transistors Q10, Q11, Q14 so that the current I9 drops rapidly to unsquelch the receiver as shown in waveform E. The voltages A and C continue to rise. When the voltage C exceeds the voltage D at the time T3, the fast-slow control circuit 16 causes the current I6 to flow through the transistor Q20. This causes conduction through the transistor Q23 and diverts some current I10 from the current I7 through the resistor R8. This causes the voltage D to drop rapidly to its lower level of approximately 3.1 volts. This increase in the current I10 causes a larger increase in the current I8 to divert some of the current I5 from the base of the transistor Q15. This reduces the current in the transistor Q15 which in turn reduces the current I4 in the transistor Q17. This causes the voltage B to rise rapidly back to its upper level of B+/2 (2.6 volts), and places the circuit in condition for fast squelching. The circuit remains in this condition until the signal terminates at the time T4. Here it should be noted that the time T3 when the signal was received and the time T4 when the signal ended is long (depending upon message time) compared to the time T1 to T3 (a few milliseconds) or the time T4 to T5 (also a few milliseconds). At the time T4, the signal decreases rapidly as shown. The voltages A and C begin to decrease. The voltage A decreases more rapidly since the transistor Q9 discharges the capacitor C1. However, the capacitor C3 must discharge through the resistor R9, which has an impedance much greater than the transistor Q9. When the voltage A falls below the upper threshold voltage B at the time T5, the transistors Q10, Q11, Q14 are turned on again, so that the current I9 flows to squelch the receiver as indicated by the waveform E. This squelching is relatively quick after termination of the signal, because the threshold voltage B is at its upper level, and the voltage A quickly falls below the voltage B. The voltage C continues to decrease, and at the time T6 becomes less than the voltage D. This diverts the current I6 through the transistors Q18, Q19, so that the current I10 decreases. This causes the voltage D to rise rapidly. This decreased current I10 also decreases the current I8, but since the voltage B is already at its upper level, no action results from the voltage C falling below the voltage D. The voltage C continues to drop until it reaches its lower stable level.

Figure 3:
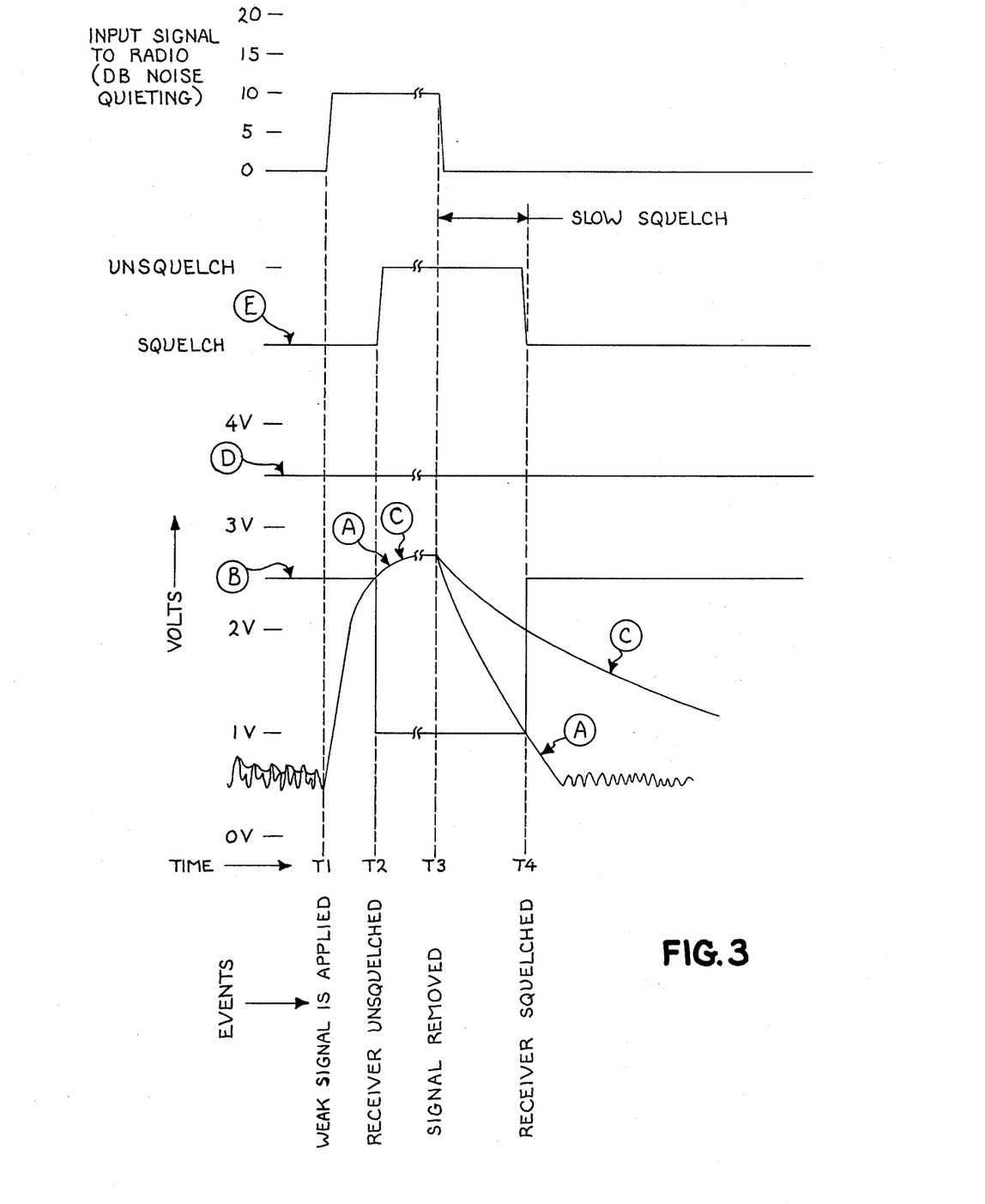

FIG. 3 shows waveforms illustrating the operation of my circuit when a weaker signal is received. At the time T1, this signal rises rapidly to a level of 10 decibels. This causes the voltages A and C to increase, but at a slower rate. Hence, the voltage A does not exceed the voltage B until the time T2, which is greater than the time T2 in FIG. 2. The receiver is unsquelched at the time T2. Thus, it will be seen that it takes the receiver long to unsquelch when the signal is weaker. When the voltage A exceeds the threshold voltage B, the voltage B is decreased as explained in connection with FIG. 2. Because of the weak signal, the voltage C never exceeds the voltage D, so that the threshold voltage D remains at its upper level. Thus, the threshold voltage B remains at its lower level. At the time T3, the signal ends. The voltages A and C begin to decrease, but since the threshold voltage B is still at its lower level, it takes longer for the voltage A to fall below this voltage B and squelch the receiver. This added time is shown by the time interval between the time T3 and T4 in FIG. 3 which is larger than the time interval between the corresponding time T4 and T5 in FIG. 2. At the time T4, the voltage A falls below the voltage B and the receiver becomes squelched again as shown in waveform E. The voltage C slowly discharges until both the voltages A and C reach their normal levels. Thus, for a weak signal, I provide a longer period of time before the receiver is squelched again. This is desirable under circumstances where a weak signal or a fade could be confused with termination of a carrier. Thus, more reliable communication is provided.

Figure 4:
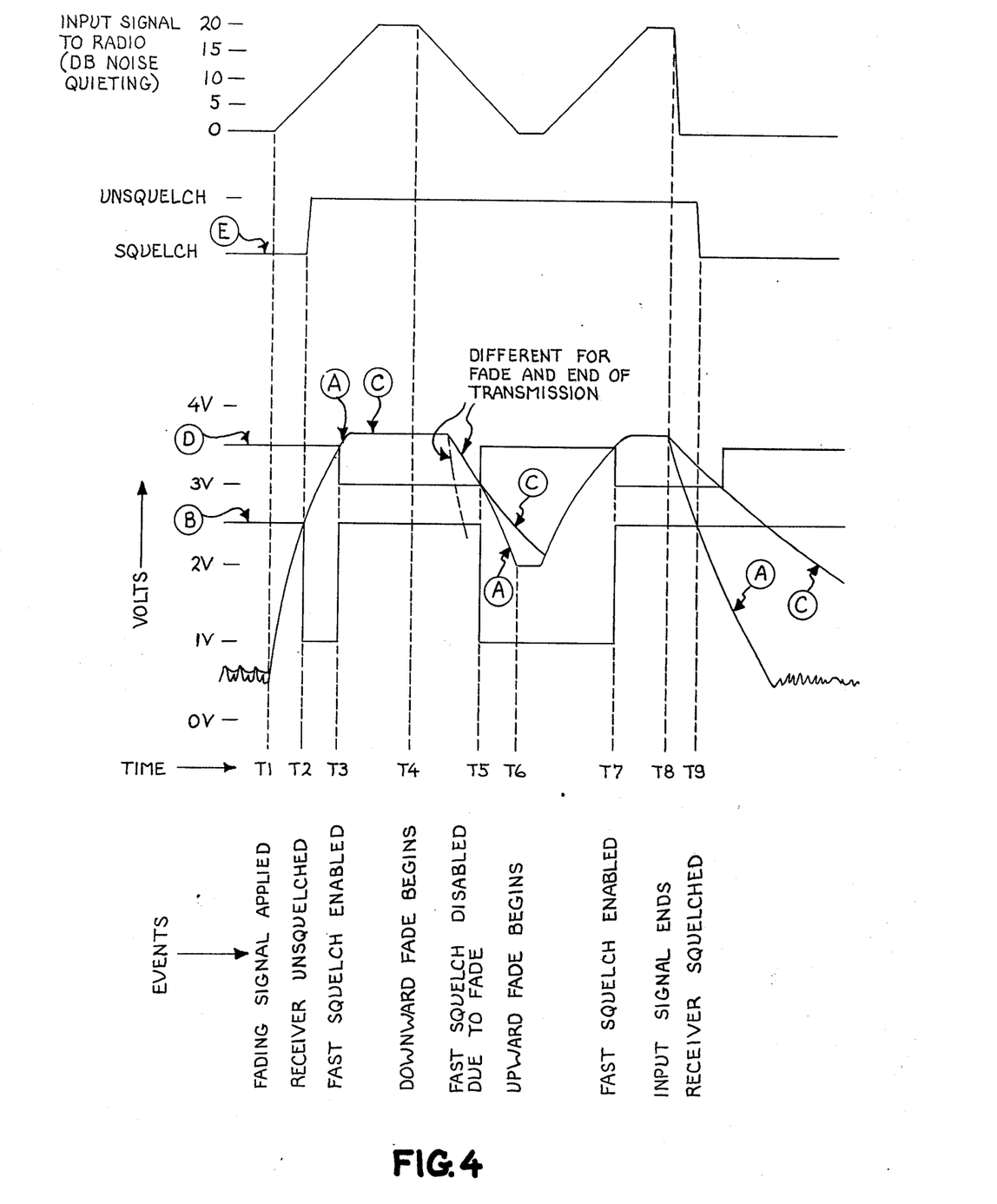

FIG. 4 shows the operation of my circuit under conditions of slowly increasing signals and slowly decreasing signals, as would be encountered under fade conditions. At the time T1, I have shown that the received input signal slowly begins to rise. This causes the voltages A and C to rise correspondingly slowly. At the time T2, the voltage A exceeds the threshold voltage B, and this causes the threshold voltage B to drop to its lower value. The receiver becomes unsquelched. The voltages A and C continue to rise, until the time T3 when the voltage C exceeds the threshold voltage D. This causes the voltage D to drop to its lower value, and also causes the threshold voltage B to rise to its upper value. The receiver could now be rapidly squelched. The voltages A and C remain at their upper values until the signal begins to fade slowly at the time T4. Because of the slow fade, capacitor C3 can discharge at about the same rate as the capacitor C1. So, the voltage C decreases at substantially the same rate as the voltage A. As a result, the voltage C falls below its lower threshold voltage D before the voltage A falls below its upper threshold voltage B. When the voltage C falls below the voltage D, the voltage D rises. The lower voltage C also causes the currents I10, I8 to decrease. A decrease in the current I8 causes the current I4 to increase. This causes the voltage B to fall, and lower the threshold voltage B in the control circuit 13. The receiver cannot now be rapidly squelched. Hence, until the voltage A falls below this lower threshold voltage B, the receiver remains unsquelched. At the time T6, I have assumed that the input signal stops fading and begins to increase again. This causes the voltages A and C to rise again until the voltage C exceeds the voltage D at the time T7. When this occurs, the voltage D is lowered to its lower value and the voltage B is raised to its upper value, also at the time T7. Again, the receiver can now be rapidly squelched. The signal continues to increase until the voltages A and C reach an upper steady state level. At the time T8, I have assumed that the signal is terminated. When this occurs, the voltage A drops rapidly below the threshold voltage B to quickly squelch the receiver. And the voltage C slowly decreases until it falls below the threshold voltage D so that the voltage D is raised to its normal upper level.

It will thus be seen that I have provided a new and improved squelch circuit which has a range of operation or levels, sometimes called hysterisis. My circuit permits a radio receiver to be rapidly unsquelched and squelched in the presence of a strong signal, to be unsquelched and squelched relatively slowly in the presence of a weaker signal, and to be unsquelched and squelched relatively slowly in the presence of a slowly rising and slowly falling (fading) signal. Thus, my circuit provides all of the advantages of a squelch circuit, and yet permits a receiver to derive the maximum amount of communication under adverse conditions, particularly weak signals or fading signals.

Persons skilled in the art will appreciate the modifications that may be made. For example, the indicated current sources may take any form preferred by a designer. Other types of control circuits can be provided to compare the input and threshold voltages. The circuit values, particularly the time constants of the timing circuit 12, 15, may be varied to suit individual needs or preferences. Therefore, while my invention has been described with reference to a particular embodiment, it is to be understood that modifications may be made without departing from the spirit of the invention or from the scope of the claims.

What I claim as new and desire to secure by Letters Patent of the United States is:

1. An improved squelch circuit for a radio receiver comprising:
   a. input means for an input signal indicative of a received radio signal;
   b. a first timing circuit connected to said input means for producing a first timing signal responsive to said input signal;
   c. a second timing circuit connected to said input means for producing a second timing signal responsive to said input signal;
   d. a squelch circuit having an input connected to said first timing circuit, having a threshold circuit for providing a first threshold signal, and having a squelch output for producing an unsquelch signal in response to said first timing signal being greater than said first threshold signal and for producing a squelch signal in response to said first timing signal being less than said first threshold signal;
   e. and a control circuit having an input connected to said second timing circuit, and having a control output connected to said threshold circuit of said squelch circuit for raising said first threshold signal in response to said second timing signal rising above a selected level.

2. An improved squelch circuit for a radio receiver comprising:
   a. input means for an input signal indicative of a received radio signal;
   b. a first timing circuit connected to said input means for producing a first timing signal responsive to said input signal;
   c. a second timing circuit connected to said input means for producing a second timing signal responsive to said input signal;
   d. a squelch circuit having an input connected to said first timing circuit, having a threshold circuit for providing a first threshold signal, and having a squelch output for producing an unsquelch signal in response to said first timing signal being greater than said first threshold signal and for producing a squelch signal in response to said first timing signal being less than said first threshold signal;
   e. and a control circuit having an input connected to said second timing circuit, having a threshold circuit for providing a second threshold signal, and having a control output connected to said threshold circuit of said squelch circuit for lowering said first threshold signal in response to said second timing signal falling below said second threshold signal before said first timing signal falls below said first threshold signal.

3. An improved squelch circuit for a radio receiver comprising:

a. input means for an input signal indicative of received radio signal;
b. a first timing circuit connected to said input means for producing a first timing signal responsive to said input signal;
c. a second timing circuit connected to said input means for producing a second timing signal responsive to said input signal;
d. a squelch circuit having an input connected to said first timing circuit, having a threshold circuit for providing a first threshold signal, and having a squelch output for producing an unsquelch signal in response to said first timing signal being greater than said first threshold signal and for producing a squelch signal in response to said first timing signal being less than said first threshold signal;
e. and a control circuit having an input connected to said second timing circuit, having a threshold circuit for providing a second threshold signal, and having a control output connected to said threshold circuit of said squelch circuit for raising said first threshold signal in response to said second timing signal rising above said second threshold signal, and for lowering said first threshold signal in response to said second timing signal falling below said second threshold signal before said first timing signal falls below said first threshold signal.

4. An improved squelch circuit for a radio receiver comprising:
a. input means for producing an input signal indicative of a received radio signal;
b. a first timing circuit connected to said input means for producing a first timing signal responsive to said input signal;
c. a second timing circuit connected to said input means for producing a second timing signal responsive to said input signal;
d. a squelch circuit having an input connected to said first timing circuit, having a threshold circuit for producing a first threshold signal having controllable upper and lower levels, and having a squelch output for producing an unsquelch signal in response to said first timing signal being greater than the level of said first threshold signal and for producing a squelch signal in response to said first timing signal being less than the level of said first threshold signal;
e. and a control circuit having an input connected to said second timing circuit, and having a control output connected to said threshold circuit of said squelch circuit for lowering said first threshold signal from said upper level to said lower level in reponse to said first timing signal rising above said upper level of said first threshold signal, and for lowering said first threshold signal from said upper level to said lower level in response to said first and second timing signals falling substantially together.

5. An improved squelch circuit for a radio receiver comprising:
a. input means for producing an input signal indicative of a received radio signal;
b. a first timing circuit connected to said input means for producing a first timing signal responsive to said input signal;
c. a second timing circuit connected to said input means for producing a second timing signal responsive to said input signal;
d. a squelch circuit having an input connected to said first timing circuit, having a threshold circuit for producing a first threshold signal having controllable upper and lower levels, and having a squelch output for producing an unsquelch signal in response to said first timing signal being greater than the level of said first threshold signal and for producing a squelch signal in reponse to said first timing signal being less than the level of said first threshold signal;
e. and a control circuit having an input connected to said second timing circuit, having a threshold circuit for producing a second threshold signal, and having a control output connected to said threshold circuit of said squelch circuit for lowering said first threshold signal from said upper level to said lower level in response to said first timing signal rising above said upper level of said first threshold signal, for raising said first threshold signal from said lower level to said upper level in response to said second timing signal rising above said second threshold signal, and for lowering said first threshold signal from said upper level to said lower level in response to said second timing signal falling below said second threshold signal before said first timing signal falls below said upper level of said first threshold signal.

6. An improved squelch circuit for a radio receiver comprising:
a. first means for producing a first signal whose magnitude is indicative of the strength of a received radio signal;
b. a timing circuit connected to said first means and having an output for producing a timing signal that increases in magnitude at a first rate in response to the magnitude increase of said first signal and that decreases in magnitude at a second rate in response to the magnitude decrease of said second signal;
c. a first control circuit having a timing signal input connected to said timing circuit output, having a threshold level circuit for producing a first threshold signal having controllable upper and lower levels and means for causing said first threshold signal to have said lower level in response to said timing signal magnitude exceeding the level of said first threshold signal, and a squelch circuit having a squelch output for producing an unsquelch signal in response to said timing signal magnitude exceeding the threshold level of said first threshold signal and for producing a squelch signal in response to said timing signal magnitude being less than the threshold level of said first threshold signal;
d. and a second control circuit having a timing signal input connected to said timing circuit output, having a threshold level circuit for producing a second threshold signal, and having an output circuit connected to said threshold level circuit of said first control circuit, said output circuit causing said first threshold signal of said first control circuit to have said upper level in response to said timing signal magnitude exceeding said second threshold signal of said second control circuit.

7. The improved squelch circuit of claim 6 wherein said output circuit of said second control circuit further causes said first threshold signal of said first control circuit to have said lower level in respose to said timing signal magnitude decreasing below said second threshold signal of said second control circuit before decreasing below said upper level of said first threshold signal of said first control circuit.

8. An improved squelch circuit for a radio receiver comprising:
   a. first means for producing a first signal whose magnitude is related to the magnitude of a received radio signal;
   b. a first timing circuit connected to said first means and having an output for producing a first timing signal whose magnitude increases at a first rate in response to the magnitude increase of said first signal and decreases at a second rate in response to the magnitude decrease of said first signal;
   c. a second timing circuit connected to said first means and having an output for producing a second timing signal whose magnitude increases at a third rate in response to the magnitude increase of said first signal and decreases at a fourth rate in response to the magnitude decrease of said first signal;
   d. a first control circuit having: a timing signal input connected to said first timing circuit output; a first threshold circuit for producing a first threshold signal having controllable upper and lower levels; means for causing said first threshold signal to have said lower level in response to said first timing signal magnitude exceeding the level of said first threshold signal; and a squelch circuit having a squelch output for producing an unsquelch signal in response to said first timing signal magnitude exceeding the level of said first threshold signal and for producing a squelch signal in response to said first timing signal magnitude being less than the level of said first threshold signal;
   e. and a second control circuit having: a timing signal input connected to said second timing circuit; a second threshold circuit for producing a second threshold signal; and a control output connected to said first threshold circuit of said first control circuit; said control output causing said first threshold signal of said first control circuit to have said lower level in response to said second and fourth decreasing rates being substantially the same and said second timing signal magnitude decreasing below said second threshold signal of said second control circuit before said first timing signal magnitude decreases below said upper level of said first threshold signal of said first control circuit.

9. The improved squelch circuit of claim 8 wherein said second control circuit further causes said first threshold signal of said first control circuit to have said upper level in response to said second timing signal magnitude exceeding the level of said second threshold signal.

* * * * *

UNITED STATES PATENT OFFICE
CERTIFICATE OF CORRECTION

Patent No. 4,132,953　　　　　　　　　Dated January 2, 1979

Inventor(s) R. J. Martin III

It is certified that error appears in the above-identified patent and that said Letters Patent are hereby corrected as shown below:

Column 2, line 42, after "DESCRIPTION OF THE PREFERRED"

insert -- EMBODIMENT -- line 43, cancel "EMBODIMENT"

Column 3, line 2, cancel "dtector" and insert -- detector --

Column 3, line 5, cancel "flow" and insert -- flows --

Column 3, line 19, cancel "is", first occurrence, and
　　　　　insert -- if --.

Signed and Sealed this

Seventeenth Day of April 1979

[SEAL]

Attest:

RUTH C. MASON　　　　　　　　DONALD W. BANNER
Attesting Officer　　　　　　Commissioner of Patents and Trademarks